United States Patent

Nightall

[19]

[11] Patent Number: 5,990,685
[45] Date of Patent: Nov. 23, 1999

[54] APPARATUS FOR AND METHOD OF MONITORING AN EARTH-LEAKAGE STATE OF A POWER DISTRIBUTION SYSTEM

[75] Inventor: John R Nightall, Leicester, United Kingdom

[73] Assignee: Cegelec Controls Limited, United Kingdom

[21] Appl. No.: 08/924,848

[22] Filed: Sep. 5, 1997

[30] Foreign Application Priority Data

Sep. 11, 1996 [GB] United Kingdom ............. 9618941

[51] Int. Cl.$^6$ .................................................. G01R 31/02
[52] U.S. Cl. ........................ 324/509; 324/522; 340/651
[58] Field of Search ................................ 324/500, 509, 324/510, 511, 522, 525, 535, 555, 704; 361/42, 46, 63, 88, 90, 91, 92, 95; 340/949, 650, 651, 661, 662, 663

[56] References Cited

U.S. PATENT DOCUMENTS

| 3,652,937 | 3/1972 | Garrot | 324/168 |
|---|---|---|---|
| 3,670,240 | 6/1972 | Maranchak et al. | 324/535 |
| 3,801,898 | 4/1974 | Young | 340/651 |
| 4,253,056 | 2/1981 | Chaudhary | 324/509 |
| 4,707,761 | 11/1987 | Podobinski | 361/93 |
| 4,896,114 | 1/1990 | Donner | 324/522 |

*Primary Examiner*—Diep N. Do
*Attorney, Agent, or Firm*—Kirschstein, et al.

[57] ABSTRACT

An earth-leakage monitoring method for a power distribution system, and in particular a DC 4-rail traction system, incorporating a pair of current-conductors (current rails) and an earth reference (a pair of running rails or an earthing system), comprises measuring the conductor-to-earth voltage for each conductor; forming a ratio of these voltages; connecting a known resistance between one conductor and earth; re-measuring the two conductor-to-earth voltages; forming a new voltage ratio, and calculating the value of leakage resistance existing between each conductor and earth using the known resistance value and the two voltage ratios. An earth-leakage fault method is also disclosed in which the earth-leakage monitoring arrangement is adapted to continuously display the value of conductor-to-earth voltage of the two conductors, the power-distribution system having a number of such monitoring arrangements along its length; the behaviour of this displayed voltage is monitored, and the monitor with the fastest indicated voltage rise time is taken to be the monitor lying in the same section of the distribution system as the fault.

21 Claims, 13 Drawing Sheets

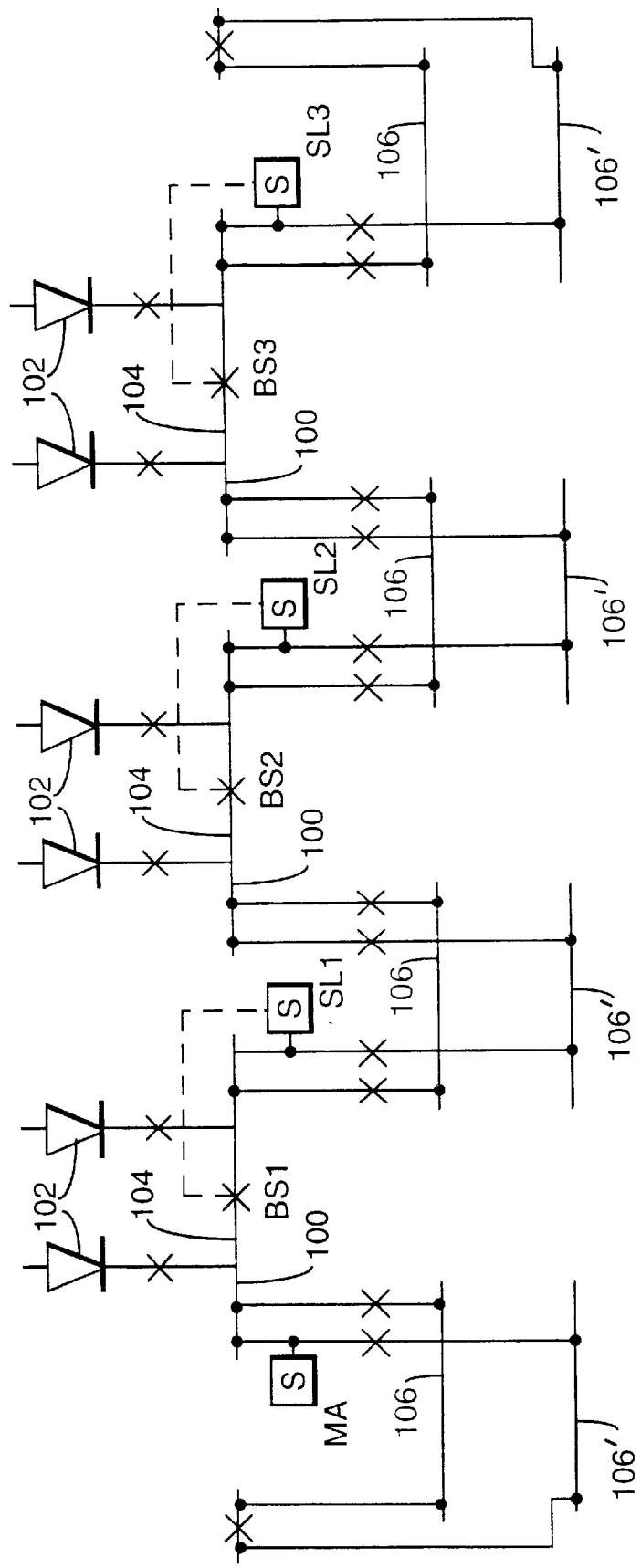

APPARATUS FOR AND METHOD OF MONITORING AN EARTH-LEAKAGE STATE OF A POWER DISTRIBUTION SYSTEM

BACKGROUND OF THE INVENTION

The invention relates to an apparatus and method for monitoring an earth-leakage state of a power distribution system, and in particular of a DC traction system.

Traction systems exist, for example the London Underground rail system, which incorporate a pair of running rails for carrying the rolling stock and a pair of current rails (conductor rails) for supplying power to that rolling stock. Such a scheme is shown very schematically in FIGS. 1 and 2, in which a pair of running rails 10, 12 secured to sleepers 14 resting on ballast 19 (see FIG. 2) are associated with, in close proximity, a pair of current rails 16, 18 insulated from the sleepers by insulators 20. Conventionally, one of the current rails 18 is situated between the running rails, this being the negative DC power rail, and the other—the positive DC power rail 20—is situated outside the running rails.

FIG. 1 shows the power supply arrangement for the DC traction system, consisting of rectifiers 30 each fed from, typically, a 22 kV substation and outputting a DC voltage of 630 V which is fed to the current rails 16, 18 by way of circuit breakers 32. The entire stretch of line is divided into sections, FIG. 1 constituting one of said sections, and each section comprises a number of sub-sections 34 each fed at opposite ends from a pair of rectifiers 30. As illustrated in the diagram, sub-section 34A is supplied on its west side by a rectifier 30A and on its east side by a rectifier 30B, sub-section 34B is supplied on its west side by a rectifier 30B and on its east side by a rectifier 30C, and so on.

In addition, in order to maximise the voltage profile between substations, i.e. minimise $I^2R$ losses in the system due to the very high supply currents (of the order of 4500 amps) needed to power the rolling stock in view of the low supply voltage employed, parallel tracks on the same section are also fed from the same respective rectifiers by their own circuit breakers, i.e. the current rails of the various parallel tracks are effectively connected in parallel. FIG. 1 shows the current rails 16', 18' of one such parallel track fed from circuit breakers 32'.

Neither of the current rails is directly connected to earth, the DC power distribution system therefore being a floating one (a so-called "isolée terre" ("IT") system), and there is a finite leakage resistance between the current rails 16, 18 (which are, by definition, uninsulated) and the running rails 10, 12 which are at earth potential. This resistance, under ideal service conditions, will be high—e.g. of the order of perhaps 100 kΩ per kilometre—and will arise, for example, from the finite resistance of the insulators 20, the normal surface condition of the insulators and sleepers and also the finite insulation resistance of the various electrical components on a train that may be standing at any particular instant on the tracks. In practice, however, the leakage resistance may be lowered due to either changed track conditions or a fault on a train present on the track.

Track-based faults may be relatively high-resistance faults due to damaged track insulators 20 or perhaps dampness, or low-resistance faults due to the shunting effect of an electrically conductive object that may have fallen onto the rails. Train-based faults are generally low-resistance faults arising from, for example, a low-slung negative shoe, which is designed to supply current to the train from the negative rail 18, accidentally making contact with a running rail when a set of points is reached, or an earth fault in the motor commutator arrangement of the train, whereby a brush may contact earth as the armature rotates.

This points up a general difference between track-based faults and train-based faults, namely that track-based faults tend to be steady faults giving rise to a constant shift in leakage resistance between the relevant current conductor and earth, whereas the train-based faults described above create by their very nature an oscillatory shift in leakage resistance.

Under no-fault conditions, the relative potentials of the current conductors 16, 18 and earth (the running rails 20) are as shown in FIG. 2, i.e. the positive conductor 16 settles at +420 V and the negative conductor 18 at −210 V relative to earth. The non-symmetrical distribution arises from the construction of the current rails and insulators in relation to the running rails.

When a fault as described earlier occurs as a first fault on a track section or sub-section, the effect is merely to shift the relative potentials between the current rails and the running rails away from their no-fault values, and in an extreme fault condition one of the current rails may be effectively at earth potential leaving the other to carry the full 630 V relative to earth. This by itself is not injurious to the electrical supply equipment since the rectifier outputs merely float with respect to earth, neither does it represent a danger to train personnel or passengers (though it may represent an increased risk to line personnel who will be nominally at earth potential), since the train itself will be at earth potential. However, what does represent a risk to train occupants is the occurrence after the appearance of the first fault of a second fault, this time between the opposite current conductor and earth and arising from a fault on the train. When this occurs there is a low-resistance path between the two current conductors which can lead to severe arcing and heat and smoke generation in equipment located on the train, passengers' lives being thereby put at risk.

Subdivision of a track system into electrically isolated sections has been one attempt to reduce the risk of the occurrence of such a second, opposite-pole, fault, but there has remained the need to detect a first fault state as quickly as possible after its occurrence so that it could be located and remedied before a second, opposite-pole fault occurred.

One well established way of monitoring an earth fault is illustrated in FIG. 3, in which bleed resistors 40 and 42 are connected between the positive and negative conductors, respectively, and earth. Resistor 40 is conventionally 200 Ω and resistor 42 100 Ω. Connected across resistor 42 is a chart recorder 44 which records changes in voltage across resistor 42. Bleed resistors of low resistance value are used to swamp the actual leakage resistance between the various points and provide a predictable 2:1 voltage ratio for operating the chart recorder within nominal limits. Two such monitors are employed in each sub-section 34, one driving the chart recorder, as illustrated, in a power control room, and the other driving a lamp as a visual alarm in a line control room.

There are severe drawbacks associated with this known monitoring method. In the first place, the low-value resistors 40, 42 dissipate much power (approximately 1.3 kW total); thus, in a typical rail system comprising of the order of 100 sub-sections, there will be a total power dissipation of 100×2×2×1.3=520 kW. Secondly, because of the low resistances used it is impossible to detect slight changes in leakage resistance resulting from the imposition of a relatively high-resistance leakage shunt path between a conductor and earth. Thus, this system masks the effect of, for example, deteriorated insulation between one of the conductors and earth. A third drawback is that, because the chart recorder 44 measures a voltage which is set by a ratio, the ratio of positive rail to earth and negative rail to earth, it cannot sense the presence of a leakage source which affects both conductors equally. An example of such a source is permanent dampness in the ballast, or flooding.

A second scheme supplements the above bleed resistor arrangement with a so-called "unbalanced current protection" arrangement in which current detectors are installed around each substation to monitor track feeder cables, relays and so forth. When two opposite-pole earth faults occur, the flow of currents in the substation become unbalanced and this imbalance is sensed by the protection arrangement and a signal is sent to trip circuit breakers at the adjacent substation which then isolate the offending sub-section. However, this protection arrangement lacks the necessary sensitivity and stability to detect single-pole faults down to earth and requires the complete isolation of sub-sections in order to arrive at definable current flows for reliable decision-making. A known system employing such current monitoring and detection of residual, fault-caused currents is described in published British patent application GB 2,247, 119A.

SUMMARY OF THE INVENTION

In accordance with a first aspect of the invention there is provided an earth-leakage monitoring apparatus for monitoring an earth-leakage state of a power distribution system, said system comprising first and second current conductors and an earth reference, the apparatus comprising:

a voltage-measuring means for measuring first and second voltage values existing between respective said first and second conductors and said earth reference;

a dividing means connected to said voltage-measuring means such as to form a ratio of said first and second voltage values;

a resistance shunting means for connecting a resistance of known value between one of said conductors and said earth reference;

a control means connected to said resistance shunting means and operational to connect said resistance between said one of said conductors and said earth reference, and a processing means connected to said dividing means and comprising means for deriving values of leakage resistance between respective said first and second conductors and said earth reference using said known resistance value and said ratio obtained before and after connection of said resistance between said one of said conductors and said earth reference.

In accordance with a second aspect of the invention, there is provided an earth-leakage monitoring apparatus for monitoring an earth-leakage state of a power distribution system, said system comprising first and second current conductors and an earth reference, the apparatus comprising:

a voltage-measuring means for measuring a first voltage existing between said conductors and a second voltage existing between one of said conductors and said earth reference;

a subtraction means connected to said voltage-measuring means such as to form a difference between said first and second voltages, said difference constituting a third voltage;

a dividing means connected to said voltage-measuring means and to said subtraction means such as to form a ratio of said second and third voltages;

a resistance shunting means for connecting a resistance of known value between one of said conductors and said earth reference;

a control means connected to said resistance shunting means and operational to connect said resistance between said one of said conductors and said earth reference, and a processing means connected to said dividing means and comprising means for deriving values of leakage resistance between respective said first and second conductors and said earth reference using said known resistance value and said ratio obtained before and after connection of said resistance between said one of said conductors and said earth reference.

The deriving means may be adapted to derive said leakage-resistance values using the formulae:

$$R_{L1} = R_S \left( \frac{V_1}{V_2} \cdot \frac{V_2'}{V_1'} - 1 \right)$$

$$R_{L2} = R_S \left( \frac{V_2'}{V_1'} - \frac{V_2}{V_1} \right)$$

The apparatus may comprise an indicating means for providing an indication of said earth-leakage state.

A comparison means may be connected between said processing means and said indicating means for forming a comparison between said leakage-resistance values and respective reference leakage-resistance values, said comparison means in use outputting a signal to said indicating means when either of said leakage-resistance values falls below its respective reference leakage-resistance value, said signal representing a conductor-to-earth fault.

The comparison means in use may output a further signal to said indicating means when both of said leakage-resistance values fall below their respective reference leakage-resistance values, said further signal representing a fault between said first conductor and earth and a fault between said second conductor and earth.

The indicating means may be connected to said voltage-measuring means thereby to provide, in use, a constant indication of conductor-to-earth voltage level. The indicating means may comprise one or more of a digital display, an analogue display, an audible alarm, a visual alarm, a print-out.

The first and second power conductors may be the positive and negative current rails, respectively, of a DC traction system and the earth reference may be constituted by the running rails of said traction system or an adjacent earth electrode system or an earthing system of switch gear adapted to control power supplied to the traction system. Alternatively, the first and second power conductors may be the current conductors of an AC power system, the earth reference being constituted by an earthing system of switch gear adapted to control the AC power system. The AC power system may be an AC power system providing power for a railway signalling system.

According to a third aspect of the invention, there is provided a method of monitoring an earth-leakage state of a power distribution system, said system comprising first and second current conductors and an earth reference, the method comprising the steps of:

(a) measuring a first ratio $V_1:V_2$ of voltages existing between respective first and second power conductors and said earth reference;

(b) connecting a resistance $R_S$ of known value between one of said power conductors and said earth reference;

(c) measuring a second ratio $V_1':V_2'$ of said voltages existing between respective first and second power conductors and said earth reference;

(d) calculating a value of leakage resistance $R_{L1}$ and $R_{L2}$ between respective said first and second power conductors and said earth reference using said known resistance value $R_S$ and said first and second ratios $V_1:V_2$, $V_1':V_2'$.

In step (d) the leakage resistances may be calculated using the formulae:

$$R_{L1} = R_S \left( \frac{V_1}{V_2} \cdot \frac{V_2'}{V_1'} - 1 \right)$$

$$R_{L2} = R_S \left( \frac{V_2'}{V_1'} - \frac{V_2}{V_1} \right)$$

The method may include the steps of:

(e) comparing said leakage-resistance value for each conductor and earth with respective reference leakage-resistance values and, (f) where said comparison indicates that a leakage-resistance value has fallen below its respective reference value, providing a visual and/or audible alarm to communicate the existence of an earth-leakage fault between the respective conductor and earth.

Where said comparison indicates that both leakage-resistance values have fallen below their associated reference values, a visual and/or audible alarm may be provided to signal the existence of a conductor-to-conductor leakage fault.

The first and second voltage ratios may be derived by a measurement of both of said first and second voltages, or only one of these may be measured together with a voltage existing between the first and second conductors, the other being derived from the difference of the latter two voltages.

The method may be applied to a three-phase power distribution system, in which case voltages are measured between respective phases and earth and a known resistance is placed between at least one of the phases and earth to obtain a changed ratio of voltages.

In accordance with a fourth aspect of the invention, there is provided a method for locating an earth-leakage fault in a section of a power distribution system incorporating first and second current conductors and an earth reference, the method comprising the steps of:

monitoring a behaviour of a voltage existing between respective said current conductors and said earth reference at a plurality of points along the section;

comparing said voltage-behaviours at said points, and ascertaining which voltage-behaviour shows the fastest rise time, the point at which the fastest rise time is detected being taken as a point situated in a part of the power distribution section containing said earth-leakage fault.

BRIEF DESCRIPTION OF THE DRAWINGS

Embodiments of the invention will now be described, by way of example only, with reference to the drawings, of which:

FIG. 7 is a schematic diagram of a traction section incorporating the earth-leakage monitoring apparatus of the invention and illustrating a first fault-location arrangement;

DESCRIPTION OF EMBODIMENTS OF THE INVENTION

Figure 1:
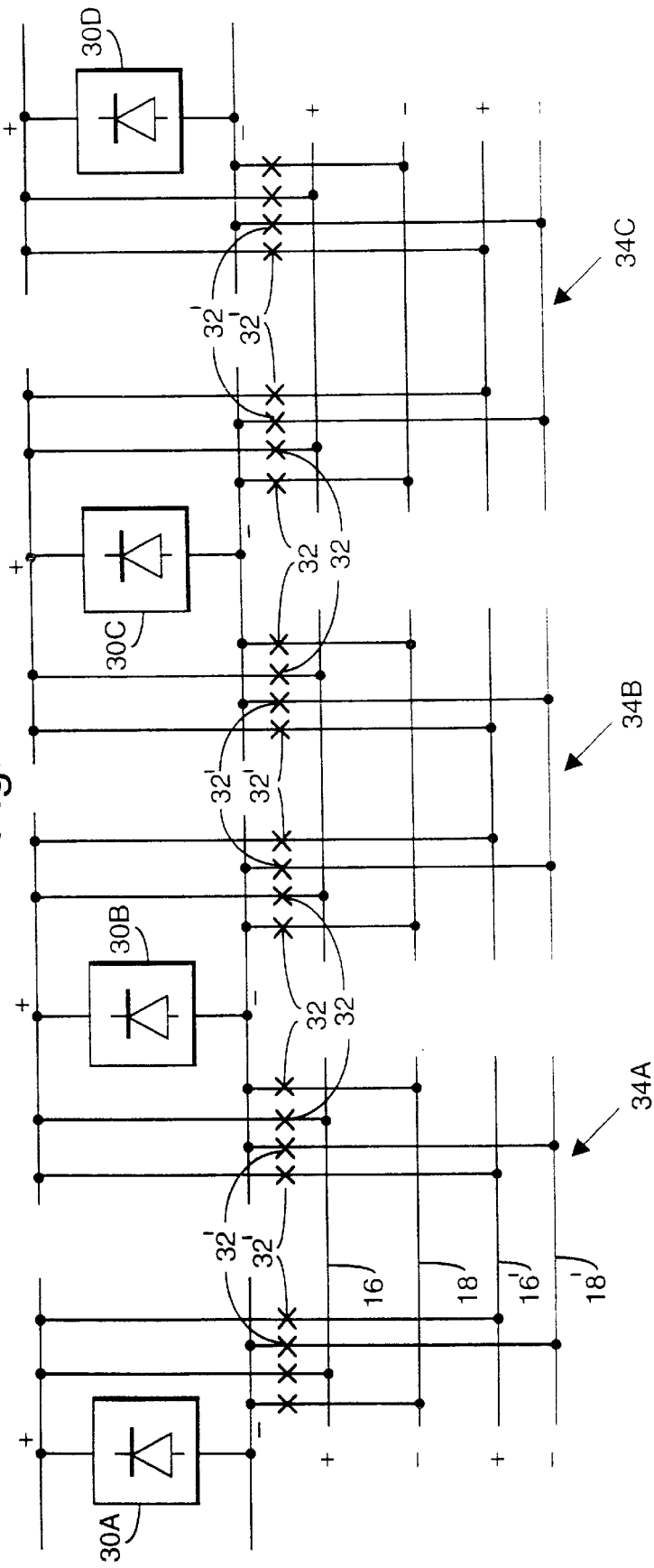
FIG. 1 is a schematic diagram of a conventional traction power distribution scheme for a section of a railway system.
Figure 2:
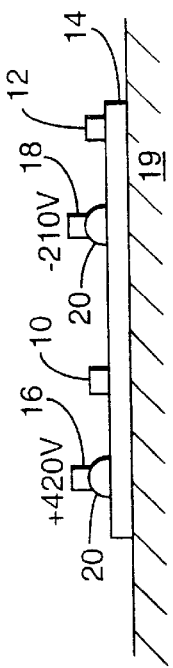
FIG. 2 is an axial view of part of the track layout of the railway system illustrated in FIG. 1.
Figure 4:
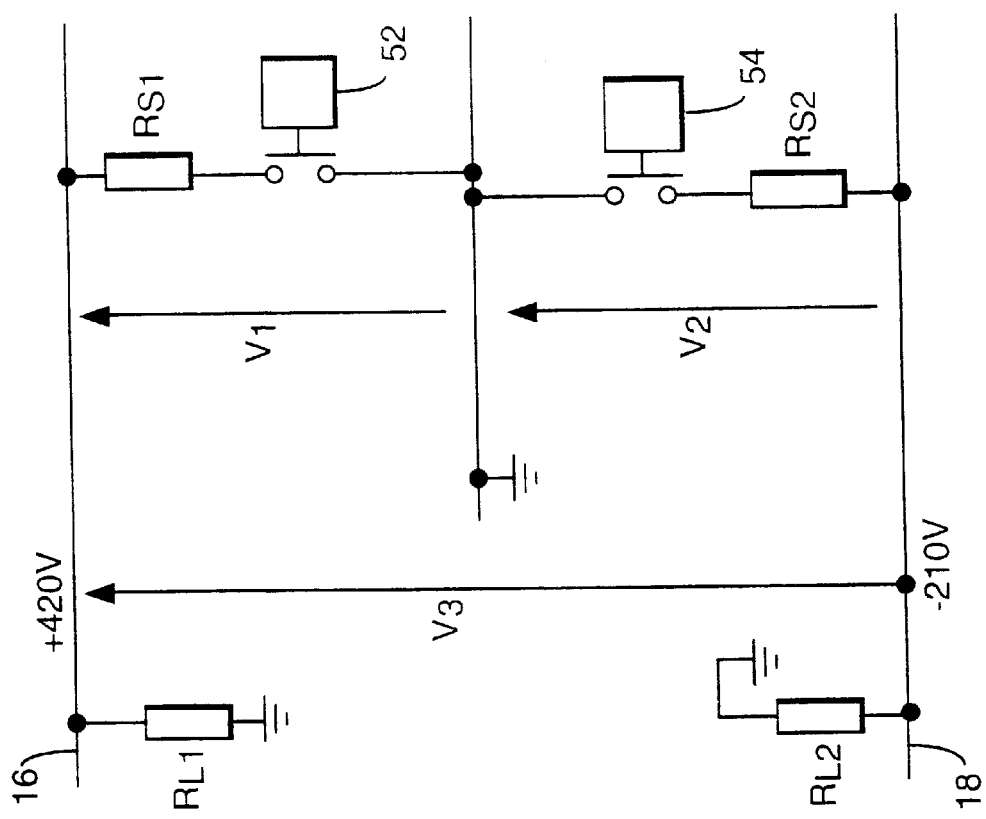
FIG. 4 is a schematic diagram illustrative of the earth-leakage monitoring apparatus according to the invention.
Figure 3:
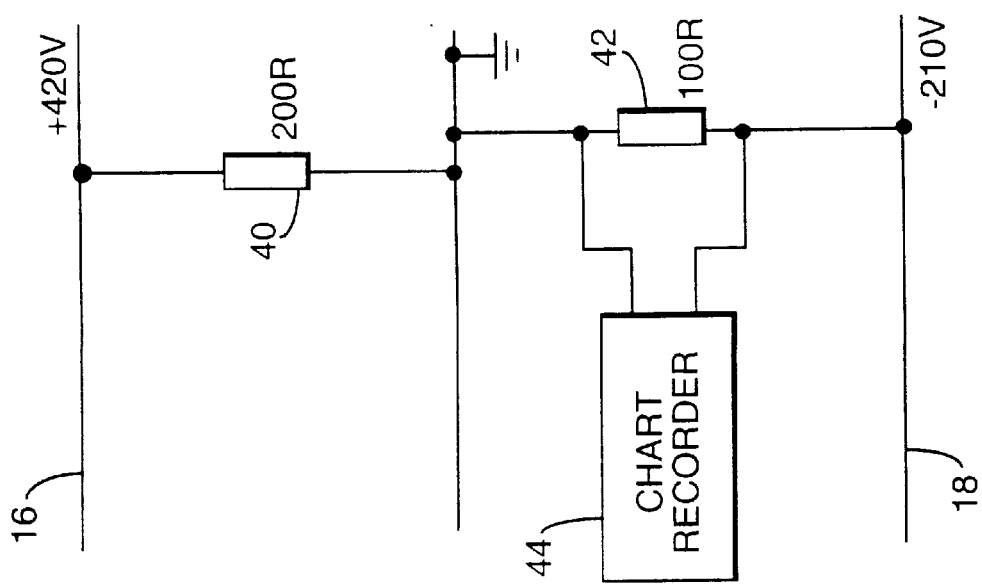
FIG. 3 is a schematic diagram of a prior-art earth-leakage monitoring arrangement.

An embodiment of an earth leakage monitoring arrangement according to the invention is shown in FIG. 4. In FIG. 4, $R_{L1}$ and $R_{L2}$ represent the "natural" leakage path resistances between positive and negative current conductors 16 and 18, respectively, and earth, the low-value bleed resistances 40, 42 present in FIG. 3 being dispensed with. Connected to respective current conductors 16, 18 are resistances $R_{S1}$ and $R_{S2}$ the other end of these resistances being taken to earth by way of respective contactors 52, 54. A method according to the invention of determining the value of the leakage resistances $R_{L1}$, $R_{L2}$ will now be described.

Firstly, the values $V_1$, $V_2$ of the voltages between the current conductors (rails) 16, 18 and earth with the contactors 52 and 54 in an open state are measured. This may be effected either by a direct measurement of these voltages themselves, or by a measurement of only one of them, e.g. $V_1$, and a measurement of the total voltage $V_3$ between the current rails, the other voltage ($V_2$) being then derived by simple subtraction of $V_1$ from $V_3$. Having obtained these voltage values, the ratio of them ($V_1/V_2$) is formed.

Next, one of the contactors 52, 54—in this case, for the sake of argument, contactor 52—is closed so as to connect its associated resistance $R_S$ across the respective current rail and earth. This causes a change in the voltages $V_1$ and $V_2$ to new values $V_1'$ and $V_2'$ which are then measured or measured and calculated, as above, following a short period to allow the new readings to settle.

Finally, the values of the leakage resistances $R_{L1}$ and $R_{L2}$ are calculated as follows:

$$\frac{R_{L1}}{R_{L2}} = \frac{V_1}{V_2} = X$$

$$\frac{R_{L1} \cdot R_{S1}}{R_{L1} + R_{S1}} \cdot \frac{1}{R_{L2}} = \frac{V_1'}{V_2'} = Y$$

-continued $$\frac{X \cdot R_{SI}}{X \cdot R_{L2} R_{SI}} = Y$$

$$(X - Y)R_{SI} = X \cdot Y \cdot R_{L2}$$

$$R_{LI} = R_{SI}\left(\frac{X}{Y} - 1\right)$$

$$R_{L2} = R_{SI}\left(\frac{1}{Y} - \frac{1}{X}\right)$$

and since $X = V_1/V_2$ and $Y = V_1'/V_2'$, $$R_{LI} = R_{SI}\left(\frac{V_1}{V_2} \cdot \frac{V_2'}{V_1'} - 1\right)$$

$$R_{L2} = R_{SI}\left(\frac{V_2'}{V_1'} - \frac{V_2}{V_1}\right)$$

Thus the actual leakage resistances can be derived from a knowledge of the conductor-to-earth voltage ratios before and after shunting with the resistance $R_S$, and from the known value of $R_S$ itself.

Figure 5:
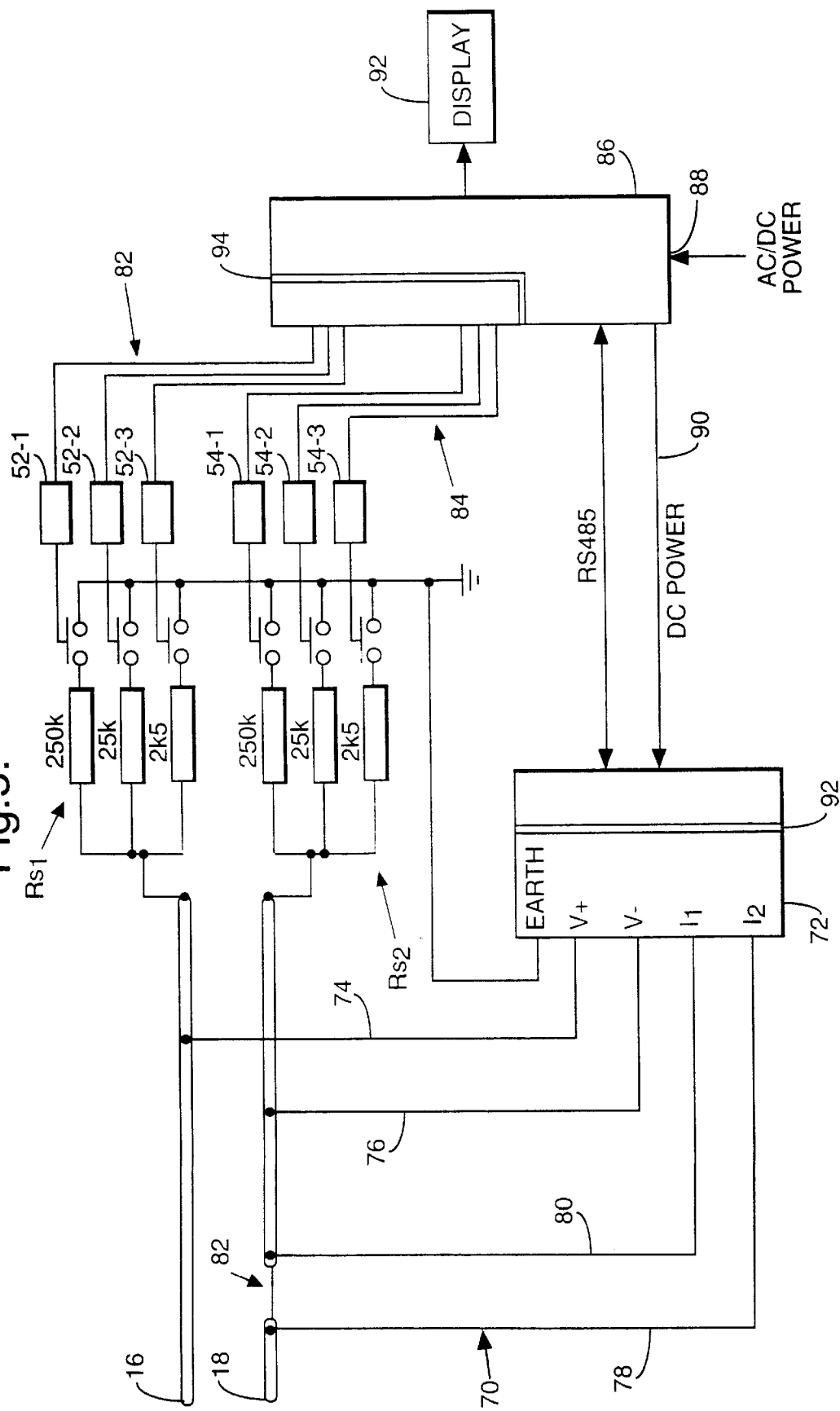
FIG. 5 is an embodiment of the earth-leakage monitoring apparatus according to the invention.
Figure 6A:
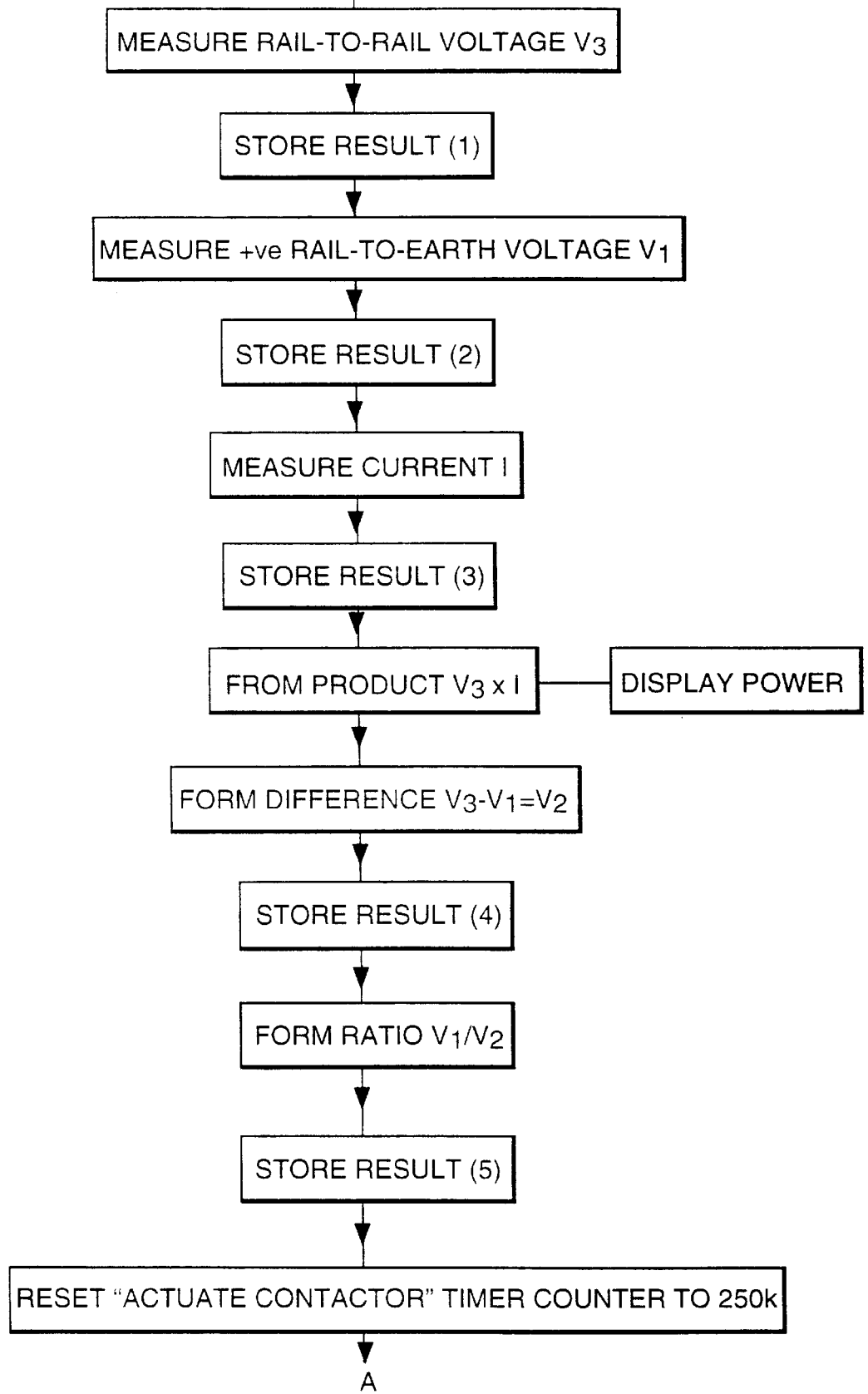
FIGS. 6a, 6b, 6c and 6d constitute, in adjoining parts, a flow diagram illustrating the operation of the monitoring apparatus of FIG. 5.
Figure 6B:
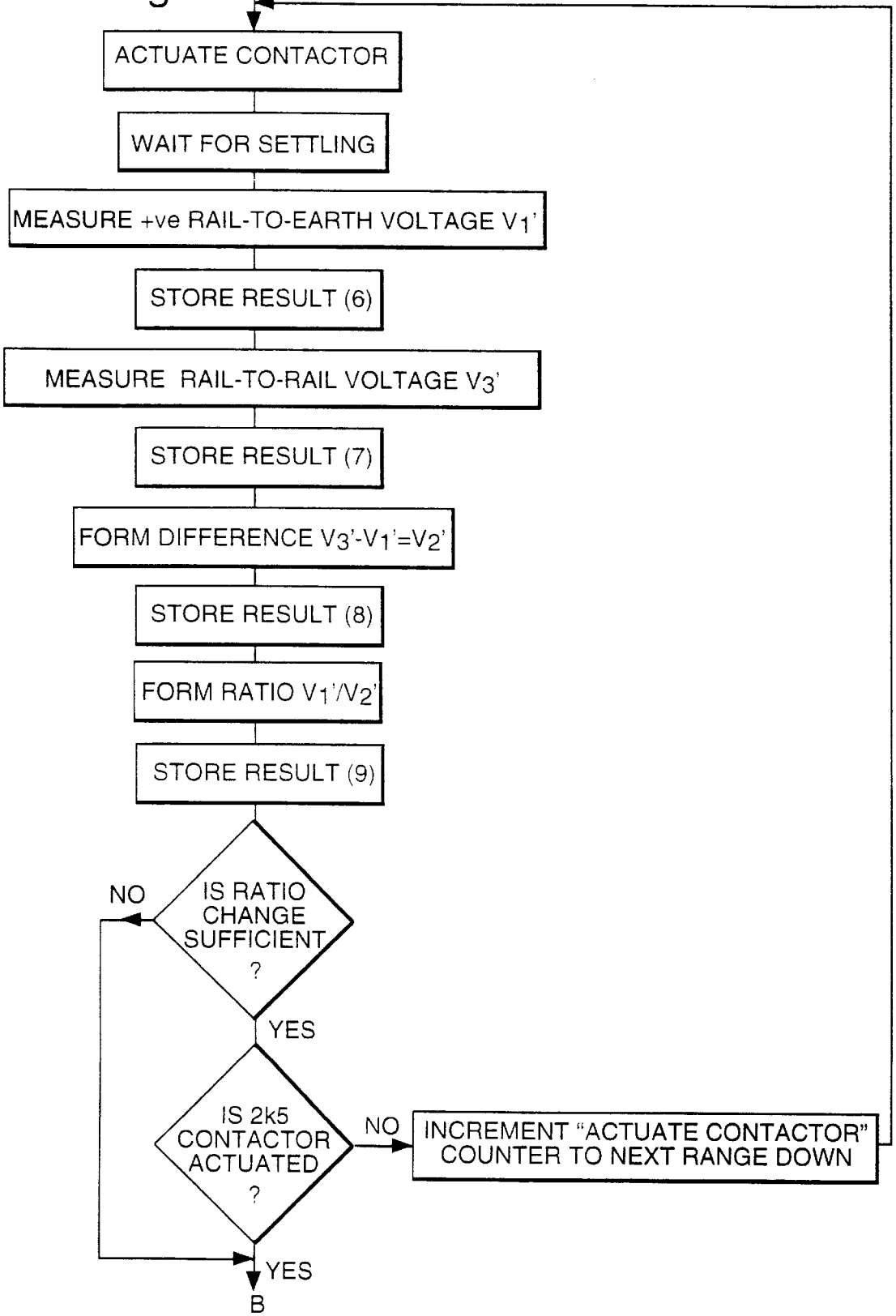
Figure 6C:
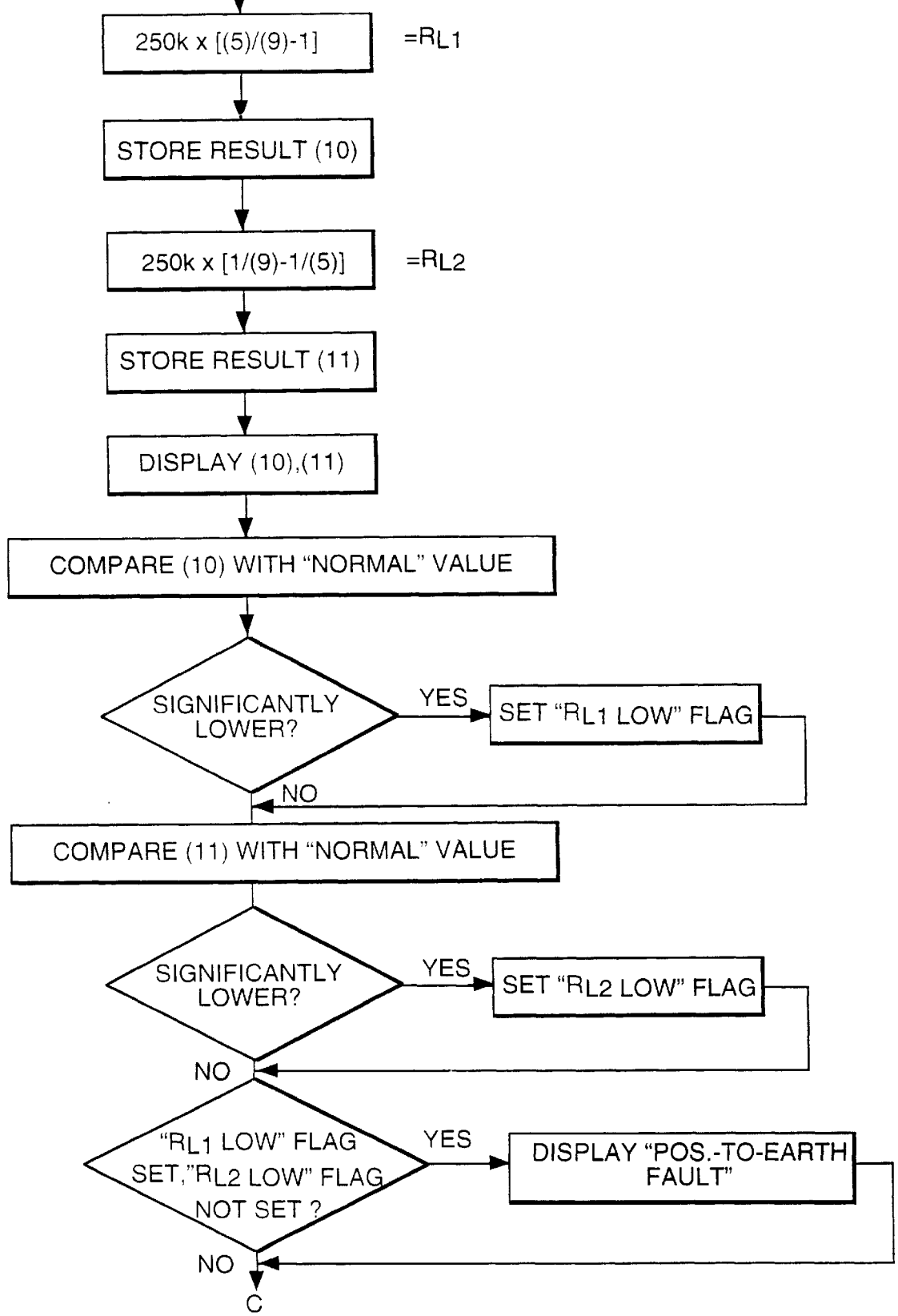
Figure 6D:
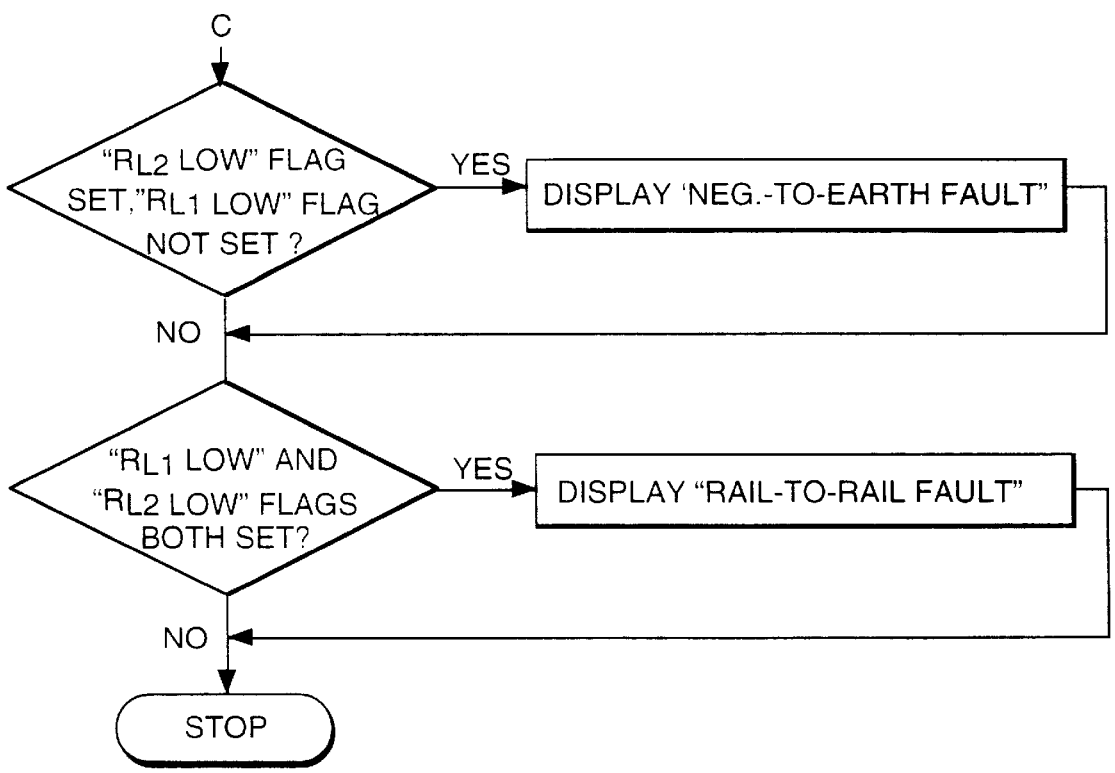

One scheme for implementing the earth-leakage monitoring arrangement according to the invention is illustrated in broad schematic terms in FIG. 5, which shows part of a sub-section of current rail 16, 18 to which are connected a number of leads 70 feeding a measurement unit 72. At one end of the rails 16, 18 are connected respective resistance arrangements $R_{S1}$, $R_{S2}$, each of these being constituted by three resistors, in this example 250 k, 25 k and 2 k5, to provide a ranging facility. The actual values of these resistors in a particular system will depend on the parameters of the system and may differ appreciably from the values given here. One end of these resistors is connected to the respective rail 16, 18 and the other end to one current pole of respective contactors 52-1, 52-2, 52-3 and 54-1, 54-2, 54-3. The other current pole of the contactors goes to earth, as does an "earth" input of the measurement unit.

Leads 74 and 76 form a connection between respective positive and negative conductor rails 16, 18 and respective V+ and V−0 inputs of the unit 72, while leads 78, 80 are connected from opposite ends of an accurately known resistance placed in series with the negative rail 18 to respective voltage inputs designated $I_1$, $I_2$ of the unit 72, these inputs representing a measure of the current being drawn from the system.

Measurement unit 72 as shown is configured to measure the power consumption of the rail system, this being made possible by a measurement of the current in one rail, the conductor 18, and the voltage across the two conductors 16, 18 and the forming of the product of these two quantities. Such a measurement is incidental to the operation of the present invention, yet is a facility which may be required for attributing power costs to train operators. Advantage is then taken of the fact that the total voltage across the conductors 16, 18 is measured by using this voltage to derive the value of one of the conductor-to-earth voltages (e.g. between V− and earth) without measuring it, this voltage being determined simply by a subtraction of the conductor-to-earth voltage that is measured (e.g. V+− to earth) from the total rail-to-rail voltage.

The energising inputs of the contactors 52, 54 are driven on lines 82, 84 from a communications unit 86 which is fed with power from an external source at an input 88 and in turn supplies power to the measurement unit 72 via a connection 90. The communications unit 86 feeds a display 92 which provides an indication of various quantities and states relating to the earth-leakage of the power distribution system.

Contained within the measurement unit 72 and communications unit 86 are respective isolation barriers 92 and 94. These are necessary in order to provide galvanic isolation between the 630 V power distribution system and areas in which operation and maintenance personnel are likely to operate. The display and controllable parts of the communication unit 86 are exposed to human contact and are therefore situated on the "safe" side of the barrier 94, while the input side of the measurement unit 72 and the part of the communications unit 86 which feeds the energising inputs of the contactors 52, 54 are in electrical contact with, or in very close proximity to, the current rails and are therefore situated on the "hot" side of the barriers 92, 94.

Communication between the two sides of each barrier takes place by a known magnetic coupling arrangement and/or by opto-couplers (not shown).

Providing the controlling function of the various operations involved in the power and earth-leakage measurements is a microprocessor (not shown) located in the measurement unit 72. This processor is programmed to perform a series of measurements and uses these measurements to arrive at various parameters relating to the earth-leakage state of the distribution system. A preferred sequence of operations is shown in the flow diagram of FIG. 6.

In FIG. 6, the monitoring routine starts by measuring the voltage between the two current rails ($V_3$), one rail-to-earth voltage ($V_1$) and current, then derives the difference between the two voltages to arrive at the other rail-to-earth voltage ($V_2$). An indication of power delivered by the distribution system is displayed. The first ratio of the two rail-to-earth voltages ($V_1/V_2$) is then formed. Next, there follows the first pass of a ranging subroutine in which the contactor 52-1 associated with the 250 k resistor of the $R_{S1}$ set is actuated to place this resistor across the positive rail 16 and earth. A short delay is initiated to allow for settling time as the various voltages change from their initial value, the new ratio with the resistor in place is then formed and a test is made to see if the change in ratio from its initial value is sufficient for the purposes of a reliable measurement. If the answer is in the negative, the resistor of the next lowest value (25 k) is placed in circuit instead, followed if necessary by the lowest-value resistor (2 k5). When a sufficiently high change in ratio is detected, the leakage-resistance values are derived via the formulae given earlier.

There then follows a comparison of the two leakage resistance values with predetermined values to establish whether or not these values are below a given threshold. Where only one value is below its respective threshold, the display is updated to indicate a positive (or negative) rail-to-earth fault; where both are below, the display shows a positive-to-earth-to negative rail fault which may be due to, for example, flooding.

This is merely one example of a suitable measurement and calculation routine, and others are possible. Thus, for example, the power measurement may be made in a completely separate routine, or even dispensed with altogether. Also, instead of the positive rail being used for the connection of the resistance set $R_S$, the negative rail may be used, in which case resistance set $R_{S2}$ is put into circuit instead of $R_{S1}$. The measurement routine may actually be arranged to select either negative or positive rail in dependence on whether or not the effect of using a particular resistance set is to move the rail-to-earth voltage ratio further away from the nominal 2:1 value, or closer to it, it being preferred to keep this ratio to as near nominal as possible in the interests of minimising stress on the insulation of the train's electrical system.

The earth-leakage state of the system is also signalled to a central control area, which then may instruct track personnel to proceed to a certain section of track to clear a fault, or inform the driver of a train with a fault not to enter a section which already has an opposite-pole fault, either on the track or on a train already on that section.

Figure 8:
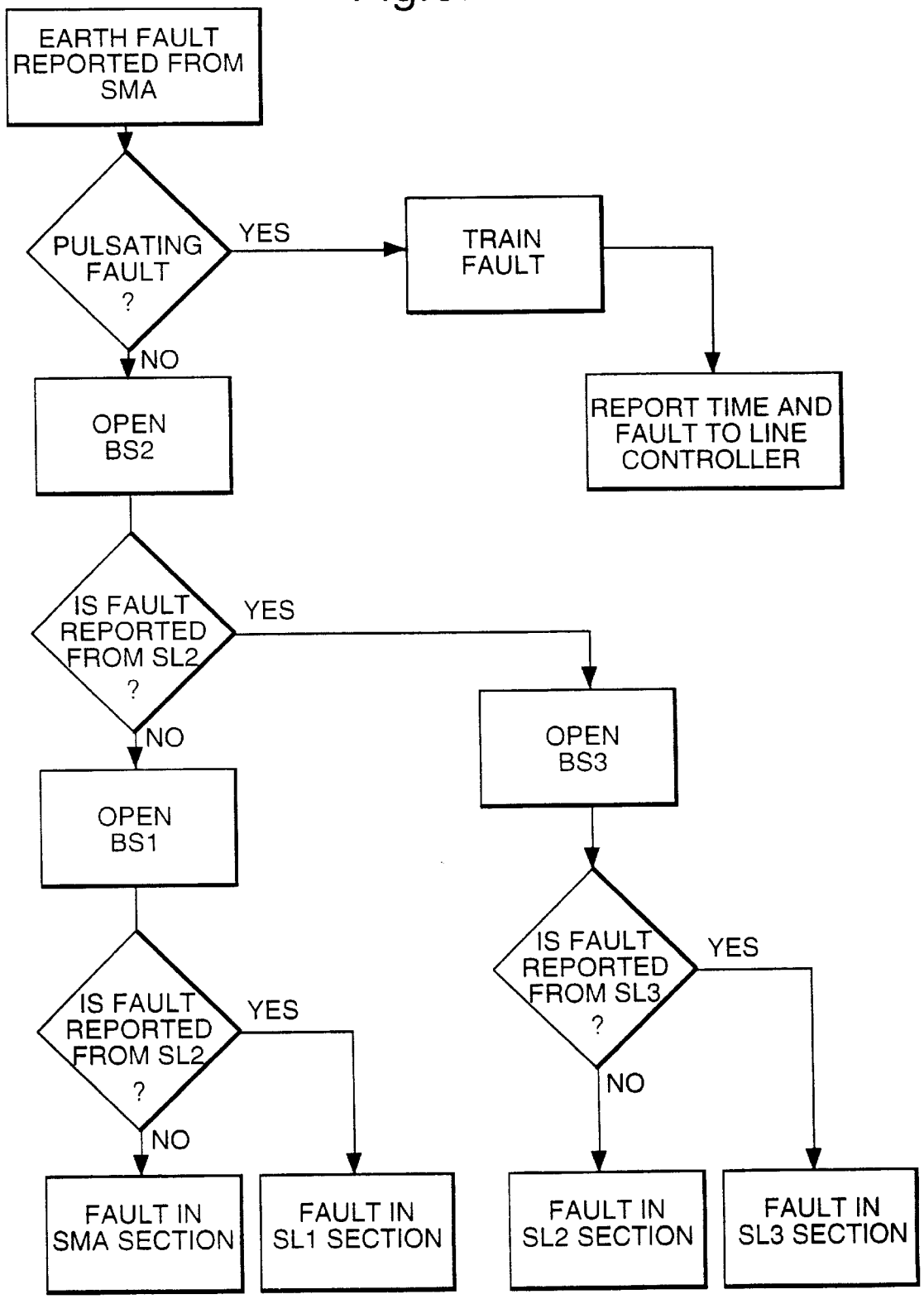
FIG. 8 is a fault-location flow diagram relating to FIG. 7.

As with the prior-art monitoring arrangements, there will normally be at least one sensor for each end of a sub-section and the preferred arrangement is to employ one sensor as a master sensor which is used to signal earth-leakage states for a whole section to the central area. The location of a fault can be identified as illustrated in FIGS. 7 and 8. In FIG. 7 a master sensor MA is located at one point on the section and slave sensors SL1, SL2, SL3, etc, are located at other points. Shown on the drawing are rectifiers 102, rectifier busbars 104, a pair of parallel tracks 106, 106' (the single lines shown represent both the positive and negative current rails associated with those tracks) and a series of circuit breakers BS1, BS2, BS3, etc, linking the various subsections in the section. Normally the circuit breakers BS1, BS2, etc, are closed. When a fault is detected by the master sensor MA the various circuit breakers are opened in a certain sequence and their associated sensors SL1, etc, polled to ascertain whether they register the fault as well. Such a sequence is described in the flow diagram of FIG. 8, in which initially a test is made to determine whether a fault originates from a train or the track, the former tending to produce a pulsating fault, the latter a steady fault, as mentioned earlier. Where the fault is a train fault, the circuit-breaker opening routine is aborted and data relating to the time and nature of the fault (e.g. which conductor is involved) are passed on to the line controller. Detection of a track fault leads to the start of the location routine proper.

An alternative scheme for fault location is applicable where faults occur fairly suddenly between one current rail and earth, and consists of having all the sensors on a section active at the same time and making an examination of the rise times of the recorded fault signals from the sensors, that sensor with the fastest rise time being reckoned as the sensor in the offending subsection. Inspection of the rise times may be visual, e.g. scanning through digital data representing the appearance of a fault, or automated by means of a computer analysis of recorded data.

This technique relies on the fact that each section of line acts as a transmission line having the usual parasitic elements, i.e. distributed inductance in each line and capacitance between each line and earth and between the two lines themselves. Thus what may start as a steep-fronted pulse at one place, due to the sudden appearance of a conductive object on that part of the line, will gradually become more rounded as the pulse propagates down the line and becomes increasingly more subject to the effects of the distributed parameters.

As already mentioned, this locating arrangement is only appropriate to fast-acting faults; slower-acting faults such as the occurrence of heavy rain and gradual flooding would normally not be locatable with this method and use of the previously described technique (FIG. 8) would then still have to be employed.

The "differential rise-time" locating method covered above requires the constant monitoring of rail-to-earth voltage in all the sensors in a particular section, otherwise a sensor not so active might miss the appearance of a fault when it arrived at the sensor's location. This would necessitate "Display $V_1$" and "Display $V_2$" commands at the appropriate points in the sensing routine illustrated, for example, in FIG. 6. Actual calculation of leakage resistance, however, would occur only periodically, the time between calculations depending on how quickly these values drifted in practice. Where drift was appreciable, leakage resistance might have to be calculated every few minutes, whereas very slow drift might require leakage resistance readings to be updated every few hours. At all events, a new calculation of leakage resistance would always be made directly following any significant change in a rail-to-earth voltage reading. Under normal circumstances, only the master sensor MA (see FIG. 7) will calculate the leakage resistances, the others will merely monitor the voltage ratio. This is to prevent interaction between the various sensors.

Figure 9:
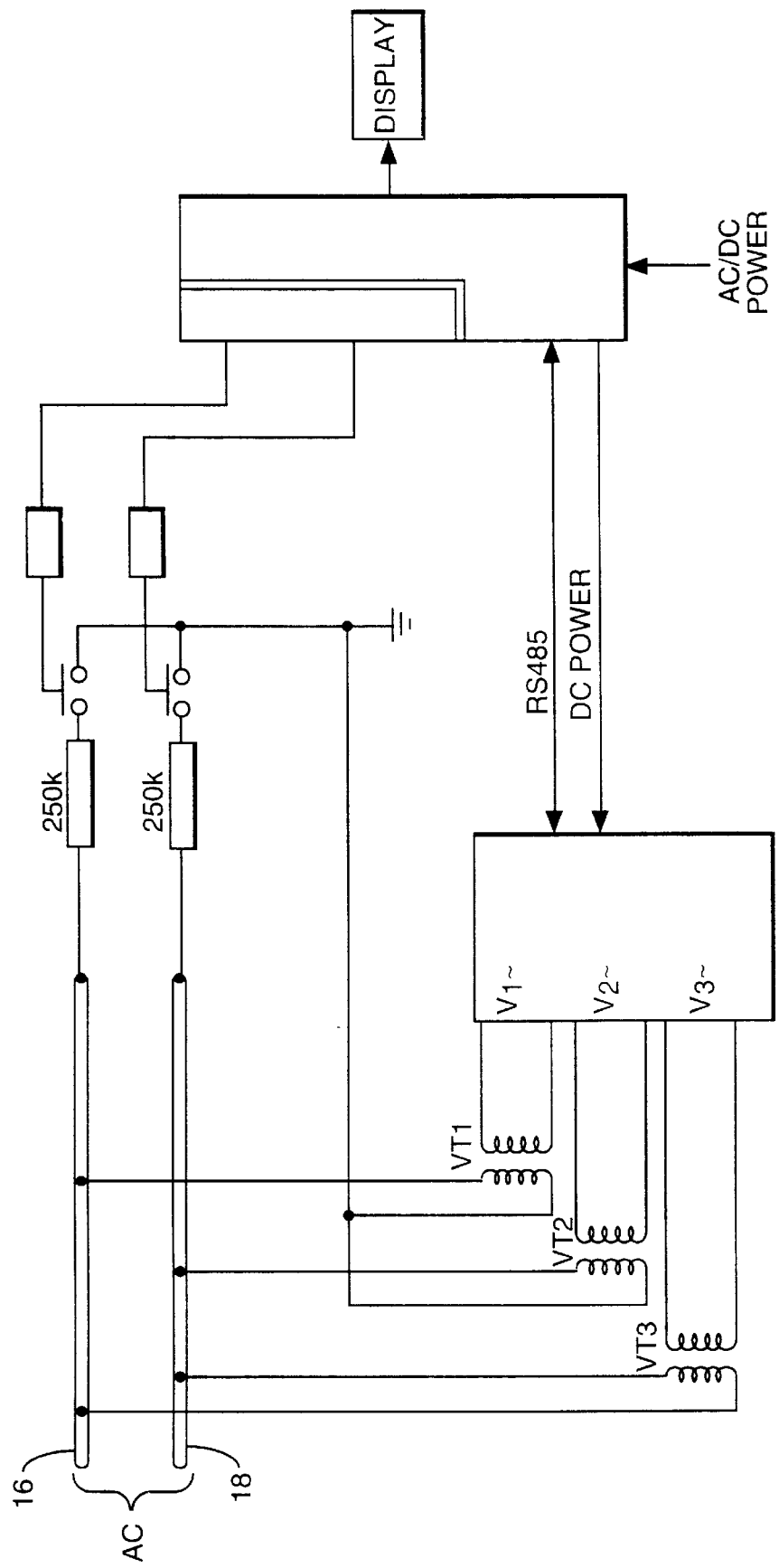
FIG. 9 is a diagram showing the use of the earth-leakage monitoring apparatus and method according to the invention for monitoring earth-leakage in an AC power supply for a railway signalling system.

While the earth-leakage sensing arrangement according to the invention has so far been described only in terms of use with a DC traction system, it may also be employed to detect changes in earth leakage in the AC signalling power supplies of a railway system. FIG. 9 shows a simplified AC signalling scheme comprising the earth-leakage monitor of the invention, in which voltage transformers VT1 and VT2 provide the voltage for input to the measuring unit 72. One of resistors $R_{S1}$ and $R_{S2}$ is used to provide the second voltage ratio, as previously described. The leakage resistance to earth of the distribution system is much higher than that of the DC traction system, so only two resistors are required, there being no need for a ranging facility. The processing of the measurements is similar to that of the DC traction system.

The system shown in FIG. 9 will also find application in any isolated single-phase distribution or wiring system described as an "IT" (isolée terre) system in BS 7671:1992.

The invention may also be applied in monitoring earth-leakage not solely in traction and signalling power systems, but also in any isolated power distribution system having floating current conductors, e.g. any low-voltage IT system (BS 7671:1992), or medium or high-voltage distribution system, either single-phase or multiphase.

Figure 10:
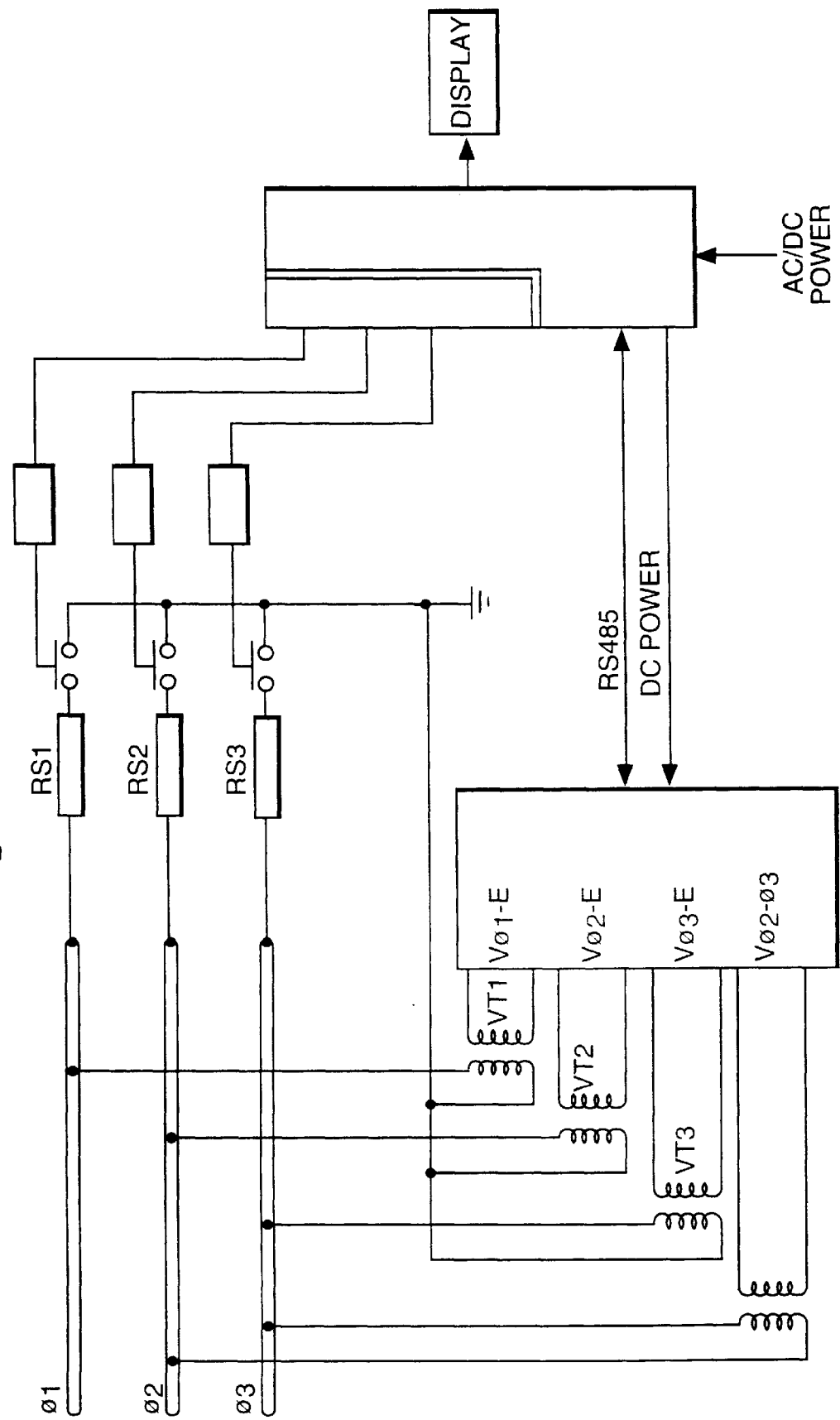
FIG. 10 is a diagram showing the use of the earth-leakage monitoring apparatus and method according to the invention for monitoring earth-leakage in a three-phase AC power supply, and FIG. 11a, 11b constitute, in two adjoining parts, a circuit diagram of a hardware embodiment of the earth-leakage monitoring apparatus according to the invention.

An example of a 3-phase system is shown in FIG. 10 in which voltage transformers VT1, VT2, VT3 and VT4 provide the voltages for input to the measuring unit 72. One or more of three resistors $R_{S1}$, $R_{S2}$ and $R_{S3}$ is used to provide the second voltage ratio as previously described. As in the AC-signalling case, the leakage resistance to earth of this distribution system is much higher than that of the DC traction system, so that no ranging is required. Again, the processing of the measurements is similar to that of the DC traction system, escept that the equation differ due to the three-phase arrangement.

Figure 11A:
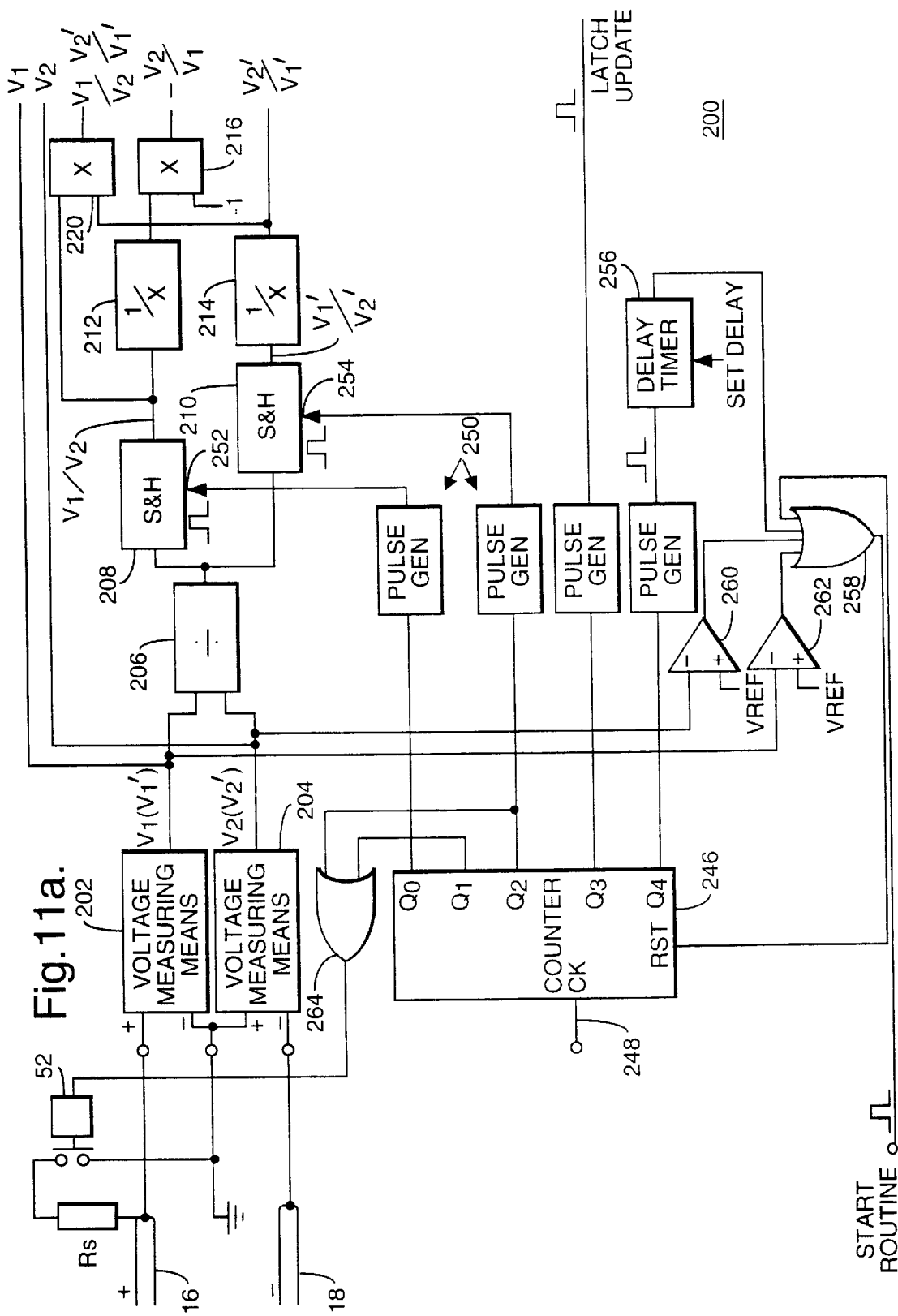
Figure 11B:
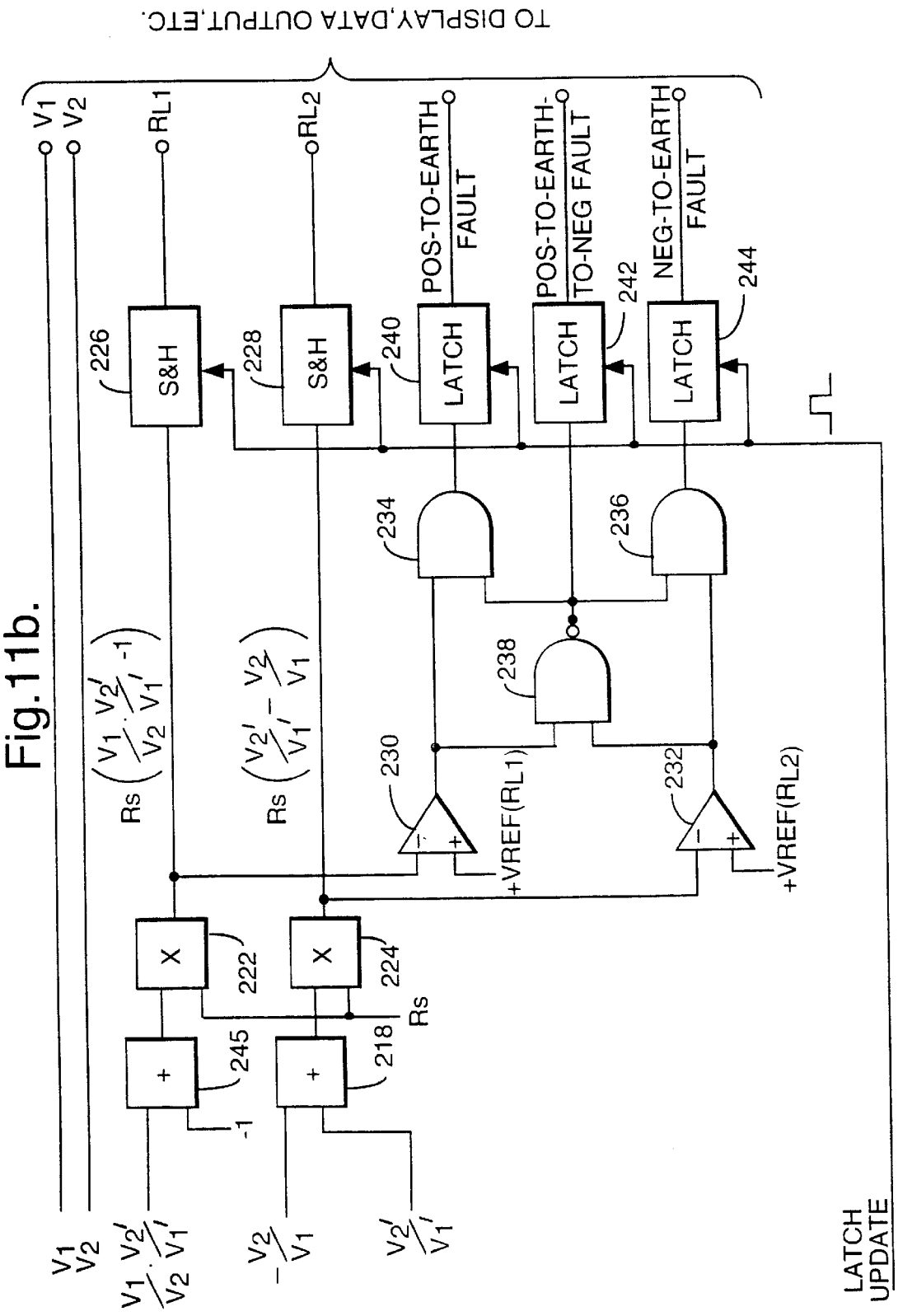

An example of a hardware embodiment of the invention is illustrated in FIG. 11. In FIG. 11 a monitoring arrangement 200 takes DC voltage levels from the current rails 16, 18 and earth reference of a DC traction system, measures both rail-to-earth voltages, forms the ratio thereof for shunt resistance $R_S$ first disconnected, then connected, and manipulates these values to arrive at values of actual leakage resistance $R_{L1}$ and $R_{L2}$. In addition, comparisons are made between these resistance values and reference values to ascertain whether the actual values have fallen below a threshold defining the existence of a fault condition, in which case an alarm condition is signalled to a display and, where required, to a remote central control area (not shown). Also signalled is the presence of a fault between positive rail and earth and negative rail and earth arising from, for example, flooding on the section of track concerned.

Two voltage-measuring means 202, 204 receive inputs from the positive current rail 16, the negative current rail 18 and earth. The outputs of the voltage-measuring means are fed to a divider 206 which outputs a signal representing the ratio of the two rail-to-earth voltages, i.e. in the first instance $V_1/V_2$. The output of the divider 206 is taken to the commoned inputs of a pair of sample-and-hold units 208, 210 which are controlled as explained later. The outputs of the sample-and-hold units are fed to the respective inputs of a pair of reciprocators, 212 and 214 which reciprocate the signal on their input and feed the reciprocal form to, in the first case, a multiplier 216 and, in the second case, a summer 218. The multiplier 216 has on its other input a signal representative of −1, i.e. the multiplier simply inverts the sign of the signal being fed to it. A second multiplier 220 has likewise two inputs fed respectively from the output of the sample-and-hold 208 and the output of the reciprocator 214, the output of the multiplier 220 supplying one input of a summer 245. The other input of the summer 245 is supplied, like the multiplier 216, with a signal representative of −1; thus this summer substracts 1 from the signal being fed to it. The second input of the summer 218 is connected to the output of the reciprocator 214.

The two summers 245 and 218 feed respective multipliers 222 and 224, which have on their other input a signal representative of the value of the shunt resistance $R_S$ this value being accurately known. On the outputs of these two multipliers 222, 224 stand signals corresponding to the values of the leakage resistance between, respectively, the positive current rail and earth and the negative current rail and earth. These two signals are fed to respective sample-and-holds 226, 228, the outputs of which are taken to a display (not shown), e.g. a chart recorder, a printer, a visual display unit (VDU), etc, and to a data transmission section for onward transmission to, for example, a central control area (not shown).

The fault alarm circuitry consists of a pair of comparators 230 and 232 fed on the one hand from respective outputs of the multipliers 222, 224 and, on the other hand, from respective reference-voltage signals representative of threshold levels of leakage resistance below which an alarm is to be raised. The outputs of the comparators 230, 232 feed respective AND-gates 234, 236 on one of their inputs and a NAND-gate 238 on its two inputs. The output of the NAND-gate 238 is connected to the other input of each of the AND-gates 234 and 236. The outputs of the AND-gates 234, 236 and NAND-gate 238 are taken to respective latches 240, 244 and 242, the outputs of which are taken to the display, etc, as fault signals relating to the occurrence of, respectively, a positive-to-earth fault, a negative-to-earth fault and a fault between positive rail and earth and between negative rail and earth.

Operation of the processing means 200 is controlled by means of a counter 246. The counter 246 is a "1-in-n" counter having, in this case, 5 outputs (n=5), only one of which is active-HIGH at any one time. The outputs go HIGH in turn in response to a clock input 248.

All the outputs of the counter 246 except the second output ($Q_1$) are connected to respective pulse generators 250 such as to provide subsequent circuitry with a pulse input in response to a steady HIGH level on the counter outputs. The first counter output ($Q_0$) is taken via its pulse generator to a "sample" input 252 of the sample-and-hold 208, the third counter output ($Q_2$) similarly to a "sample" input 254 of the sample-and-hold 210, the fourth output ($Q_3$) to a "latch" input of all five latches 226, 228, 240, 242 and 244, and the fifth output ($Q_4$) to a delay section comprising a delay timer 256, a four-input OR-gate 258 and two comparators 260 and 262. One input of the comparators 260, 262 is fed from respective outputs of the voltage-measuring means 204, 202, while the other input of each comparator is supplied with a reference voltage level $V_{REF}$. The four inputs of the OR-gate 258 are fed from, respectively, the output of comparator 260, the output of comparator 262, the output of the delay timer 256 and an external "start routine" signal.

Finally, an OR-gate 264 fed on its two inputs from the second and third outputs ($Q_1$, $Q_2$) of the counter 246 controls from its output a contactor 52 which acts to place shunt $R_S$ across the positive current rail and earth. (It is assumed for the sake of simplicity in this realisation that only one shunt resistor is employed).

In operation, the voltage levels between each current rail and earth are monitored on a continuous basis by the voltage-measuring means 202 and 204 and the values of these voltages are displayed, likewise continuously, on the display (not shown). At the same time the ratio $V_1/V_2$ at the output of the divider 206 is taken to the inputs of the sample-and-holds 208, 210, but this ratio signal is not passed on to the ouputs of the sample-and-holds since a positive pulse signal has not yet appeared on the "sample" inputs 252, 254. Thus the outputs of the sample-and-holds are old values still stored from a previous measurement routine.

A "start routine" signal is sent to the processing means 200 which, via the OR-gate 258 resets the counter 246 and places a HIGH logic level on the first output $Q_0$ of the counter. This HIGH level causes a positive pulse to be produced from the pulse generator associated with that first output and this pulse serves to place the sample-and-hold 208 in its "sample" mode, followed by its "hold" mode. Thus, there is a signal held at the output of the sample-and-hold 208 which represents the ratio $V_1/V_2$. A clock signal is now applied to the counter and the second counter output $Q_1$ goes HIGH placing, via the OR-gate 264 and the contactor 52, the resistor $R_S$ between the positive rail and earth. A new ratio is now formed at the output of the divider 206, i.e. ratio $V_1'/V_2'$, which is fed to the input of both sample-and-holds, but both sample-and-holds are in a previous "hold" mode and the new ratio signal is not passed on at this stage.

Application of a further clock signal turns $Q_1$LOW and $Q_2$HIGH which places a positive pulse on the "sample" input of the sample-and-hold 210. This causes this sample-and-hold to sample the new voltage ratio and then hold it, so that the output of this sample-and-hold now has a signal corresponding to the new voltage ratio. Both the old and new voltage ratios are held (stored) by the sample-and-holds during the rest of the routine.

The analogue reciprocators 212, 214, multipliers 220, 216, 222, 224 and summers 220, 218 making up the leakage-resistance deriving part of the processing means now produce final values of these resistances which are eventually fed to the display and other output devices. At the same time comparisons are made in the comparators 230, 232 between these values and threshold values $V_{REF}(RL_1)$ and $V_{REF}(RL_2)$ and when $RL_1$ is lower than the threshold value the positive output of the comparator 230 is taken to the latch 240; when RL2 is lower than its threshold value the positive output of the comparator 232 is taken to the latch 244, and when both leakage resistance values are below their respective thresholds a signal is sent to latch 242. Only when both leakage-resistance values are below threshold is the output of the NAND-gate 238 LOW, thus disabling AND-gates 234 and 236 so that the presence of a leakage fault between both rails and earth does not raise both "single fault" alarms but raises the "double fault" alarm instead via latch 242.

Arrival of another clock signal activates the fourth counter output $Q_3$ which applies a pulse to each of the latches and passes on the latest status values of leakage resistance and the three "threshold" indications. Yet another clock signal causes counter output $Q_4$ to go HIGH and trigger the delay timer 256 which has been set by a delay input to time out after a pre-determined time interval. At the end of the delay period a HIGH on the timer output resets the counter via the OR-gate 258 and the measurement routine is recommenced.

The counter may also be reset where it is found that one of the voltage values $V_1/V_2$ being continuously monitored has during the delay dropped significantly below a certain threshold. This threshold, which will be different for the two current rails in view of the different nominal values of the rail-to-earth voltages (420 V versus 210 V), is set at the VREF inputs of the comparators 260, 262, the outputs of these comparators going HIGH where the thresholds are dropped below and resetting the counter via the OR-gate 258.

Whereas FIG. 11 shows the use of a pair of voltage-measuring means 202, 204 feeding the divider 206 which then feeds the sample-and-holds 208, 210, in practice a single voltage-measuring means could be employed which fed respective sample-and-holds directly, the outputs of the sample-and-holds then being taken to the divider. This, however, would result in a more complex system in the sense that the single voltage-measuring means would have to be multiplexed between the two current rails during the measurement cycle.

I claim:

1. Earth leakage monitoring apparatus for monitoring an earth-leakage state of a power distribution system, said system comprising first and second current conductors and an earth reference, the apparatus comprising:
   - a voltage-measuring means for measuring first and second voltage values existing between respective said first and second current conductors and said earth reference;
   - a dividing means connected to said voltage-measuring means such as to form a ratio of said first and second voltage values;
   - a resistance shunting means for connecting a resistance of known value between one of said current conductors and said earth reference;
   - a control means connected to said resistance shunting means and operational to connect said resistance between said one of said current conductors and said earth reference, and
   - a processing means connected to said dividing means and comprising means for deriving values of leakage resistance between respective said first and second current conductors and said earth reference using said known resistance value and said ratio obtained before and after connection of said resistance between said one of said current conductors and said earth reference.

2. Earth leakage monitoring apparatus for monitoring an earth-leakage state of a power distribution system, said system comprising first and second current conductors and an earth reference, the apparatus comprising:
   - a voltage-measuring means for measuring a first voltage existing between said current conductors and a second voltage existing between one of said current conductors and said earth reference;
   - a subtraction means connected to said voltage-measuring means such as to form a difference between said first and second voltages, said difference constituting a third voltage;
   - a dividing means connected to said voltage-measuring means and to said subtraction means such as to form a ratio of said second and third voltages;
   - a resistance shunting means for connecting a resistance of known value between one of said current conductors and said earth reference;
   - a control means connected to said resistance shunting means and operational to connect said resistance between said one of said current conductors and said earth reference, and
   - a processing means connected to said dividing means and comprising means for deriving values of leakage resistance between respective said first and second current conductors and said earth reference using said known resistance value and said ratio obtained before and after connection of said resistance between said one of said current conductors and said earth reference.

3. Apparatus as claimed in claim 1, in which said deriving means is adapted to derive said leakage-resistance values using the formulae:

$$R_{L1} = R_S\left(\frac{V_1}{V_2} \cdot \frac{V_2'}{V_1'} - 1\right)$$

$$R_{L2} = R_S\left(\frac{V_2'}{V_1'} - \frac{V_2}{V_1}\right).$$

4. Apparatus as claimed in claim 1, comprising an indicating means for providing an indication of said earth-leakage state.

5. Apparatus as claimed in claim 4, comprising a comparison means connected between said processing means and said indicating means for forming a comparison between said leakage-resistance values and respective reference leakage-resistance values, said comparison means in use outputting a signal to said indicating means when either of said leakage-resistance values falls below its respective reference leakage-resistance value, said signal representing a conductor-to-earth fault.

6. Apparatus as claimed in claim 5, in which said comparison means in use outputs a further signal to said indicating means when both of said leakage-resistance values fall below their respective reference leakage-resistance values, said further signal representing a fault between said first current conductor and earth and a fault between said second current conductor and earth.

7. Apparatus as claimed in claim 4, in which said indicating means is connected to said voltage-measuring means thereby to provide, in use, a constant indication of conductor-to-earth voltage level.

8. Apparatus as claimed in claim 4, in which said indicating means comprises one or more of a digital display, an analogue display, an audible alarm, a visual alarm, a print-out.

9. Apparatus as claimed in claim 1, in which the first and second current conductors are the positive and negative current rails, respectively, of a DC traction system and the earth reference is constituted by one of the following: the running rails of said traction system, an adjacent earth electrode system, an earthing system of switch gear adapted to control power supplied to the traction system.

10. Apparatus as claimed in claim 1, in which the first and second current conductors are the current conductors of an AC power system, and in which the earth reference is constituted by an earthing system of switchgear adapted to control the AC power system.

11. Apparatus as claimed in claim 10, in which the AC power system is an AC power system providing power for a railway signalling system.

12. A method of monitoring an earth-leakage state of a power distribution system, said system comprising first and second current conductors and an earth reference, the method comprising the steps of:
 (a) measuring a first ratio $V_1:V_2$ of voltages existing between respective said first and second current conductors and said earth reference;
 (b) connecting a resistance $R_S$ of known value between one of said current conductors and said earth reference;
 (c) measuring a second ratio $V_1':V_2'$ of said voltages existing between respective said first and second current conductors and said earth reference; and
 (d) calculating a value of leakage resistance $R_{L1}$ and $R_{L2}$ between respective said first and second current conductors and said earth reference using said known resistance value $R_S$ and said first and second ratios $V_1:V_2$, $V_1':V_2'$.

13. Method according to claim 12, in which in step (d) the leakage resistances are calculated using the formulae:

$$R_{L1} = R_S\left(\frac{V_1}{V_2} \cdot \frac{V_2'}{V_1'} - 1\right)$$

$$R_{L2} = R_S\left(\frac{V_2'}{V_1'} - \frac{V_2}{V_1}\right).$$

14. Method according to claim 12, including the steps of
 (e) comparing said leakage-resistance value for each current conductor and earth with respective reference leakage-resistance values and,
 (f) where said comparison indicates that a leakage-resistance value has fallen below its respective reference value, providing a visual and/or audible alarm to communicate the existence of an earth-leakage fault between the respective current conductor and earth.

15. Method according to claim 14, in which, where said comparison indicates that both leakage-resistance values have fallen below their associated reference values, a visual and/or audible alarm is provided to signal the existence of a conductor-to-conductor leakage fault.

16. Method according to claim 12, in which the first and second current conductors are the positive and negative current rails, respectively, of a DC traction system and the earth reference is constituted by the running rails of said traction system.

17. Method according to claim 16, in which the positive current rail is situated outside the running rails and the negative current rail is situated between the running rails, the current conductor used in step (b) being selected such that the ratio obtained in step (c) is closer to 2:1 than the ratio obtained in step (a).

18. Method according to claim 12, in which the first and second current conductors are the current conductors of an AC power system, and in which the earth reference is constituted by an earthing system of switchgear adapted to control the AC power system.

19. Method as claimed in claim 18, in which the AC power system is an AC power system providing power for a railway signalling system.

20. Method according to claim 12, in which said first and second voltage ratios are derived by a measurement of said first and second voltages.

21. Method according to claim 12, in which said first and second voltage ratios are derived by a measurement of one of said first and second voltages $V_1$, $V_2$ and of a voltage $V_3$ across said first and second current conductors, and by a calculation of the other of said first and second voltages $V_2$, $V_1$ by the formation of a difference of said voltage $V_3$ across said first and second current conductors and said one of said first and second voltages $V_1$, $V_2$.

* * * * *